(12) United States Patent
Watson

(10) Patent No.: US 7,528,658 B2
(45) Date of Patent: May 5, 2009

(54) THRESHOLD VOLTAGE COMPENSATION FOR A TWO STAGE AMPLIFIER

(75) Inventor: Minh V. Watson, Fremont, CA (US)

(73) Assignee: Toshiba America Electronic Components, Inc.

( * ) Notice: Subject to any disclaimer, the term of this patent is extended or adjusted under 35 U.S.C. 154(b) by 37 days.

(21) Appl. No.: 11/831,410

(22) Filed: Jul. 31, 2007

(65) Prior Publication Data

US 2008/0197928 A1    Aug. 21, 2008

Related U.S. Application Data

(60) Provisional application No. 60/890,362, filed on Feb. 16, 2007.

(51) Int. Cl.
   *H03F 3/45* (2006.01)
(52) U.S. Cl. ...................... 330/258; 330/310
(58) Field of Classification Search ................ 330/258, 330/253, 98, 310, 150
   See application file for complete search history.

(56) References Cited

U.S. PATENT DOCUMENTS

| | | | | |
|---|---|---|---|---|
| 5,166,635 | A * | 11/1992 | Shih | 330/253 |
| 5,276,405 | A * | 1/1994 | Mazzucco et al. | 330/257 |
| 6,577,185 | B1 * | 6/2003 | Chandler et al. | 330/9 |
| 6,741,130 | B2 * | 5/2004 | Wey et al. | 330/253 |
| 6,940,348 | B2 * | 9/2005 | Confalonieri et al. | 330/69 |

* cited by examiner

*Primary Examiner*—Henry K Choe
(74) *Attorney, Agent, or Firm*—Tucker Ellis & West LLP

(57) ABSTRACT

In an example embodiment, an apparatus, such as a two stage operational amplifier, comprising a first stage amplifier having an input and an output, and a second stage amplifier having an input and an output, the input of the second stage amplifier is coupled to the output of the first stage amplifier. A first bias circuit is operable to set a common mode voltage of the first amplifier. A second bias circuit is operable to set a common mode voltage of the second amplifier. A first feedback circuit is coupled to the first bias circuit and the output of the first stage. The first feedback circuit is operable to control the common mode voltage of the first stage amplifier based on the common mode voltage set by the first bias circuit and the output of the first stage amplifier.

11 Claims, 6 Drawing Sheets

THRESHOLD VOLTAGE COMPENSATION FOR A TWO STAGE AMPLIFIER

CROSS-REFERENCE TO RELATED APPLICATIONS

This application claims the benefit of priority of U.S. Provisional Application No. 60/890,362 filed Feb. 16, 2007.

BACKGROUND

A problem with the fabrication of two stage amplifiers, such as a two state operational amplifier (Op Amp) is that the process can vary significantly over process corners. This causes the common-mode voltage of the first stage to reduce the operating range of the second stage, which can even cause the second state to drop out of the saturation region.

Previous two gain state Op Amps either use one common-mode feedback circuit, or two common-mode feedback circuits that set the common-mode voltage for both stages. This results in the same common-mode voltage for the first and second stages.

Overview of Example Embodiments

The following presents a simplified summary to provide a basic understanding of some aspects of the example embodiments. This summary is not an extensive overview of the example embodiments. It is intended to neither identify key or critical elements of the invention nor delineate the scope of the invention. Its sole purpose is to present some concepts of the example embodiments in a simplified form as a prelude to the more detailed description that is presented later.

In accordance with an example embodiment, there is disclosed herein an amplifier comprising a first stage and a second stage. The common-mode voltage of the first stage is set independently of the second stage. This allows the second stage of the amplifier to have an increased output operating range.

In an example embodiment, there is disclosed herein an apparatus, such as a two stage operational amplifier, comprising a first stage amplifier having an input and an output, and a second stage amplifier having an input and an output, the input of the second stage amplifier coupled to the output of the first stage amplifier. A first bias circuit is operable to set a common mode voltage of the first amplifier. A second bias circuit is operable to set a common mode voltage of the second amplifier. A first feedback circuit is coupled to the first bias circuit and the output of the first stage. The first feedback circuit is operable to control the common mode voltage of the first stage amplifier based on the common mode voltage set by the first bias circuit and the output of the first stage amplifier.

In an example embodiment, there is disclosed herein a method comprising setting a common mode voltage for a first stage differential amplifier, and setting a common mode voltage for a second stage differential amplifier in cascade with the first stage differential amplifier. The method further comprises acquiring feedback from outputs of the first stage amplifier, and adjusting the common mode voltage for the first stage based on the feedback acquired from the outputs of the first stage amplifier.

BRIEF DESCRIPTION OF THE DRAWINGS

The accompanying drawings incorporated herein and forming a part of the specification, illustrate examples of the present invention, and together with the description serve to explain the principles of the invention.

DESCRIPTION OF EXAMPLE EMBODIMENTS

Figure 1:
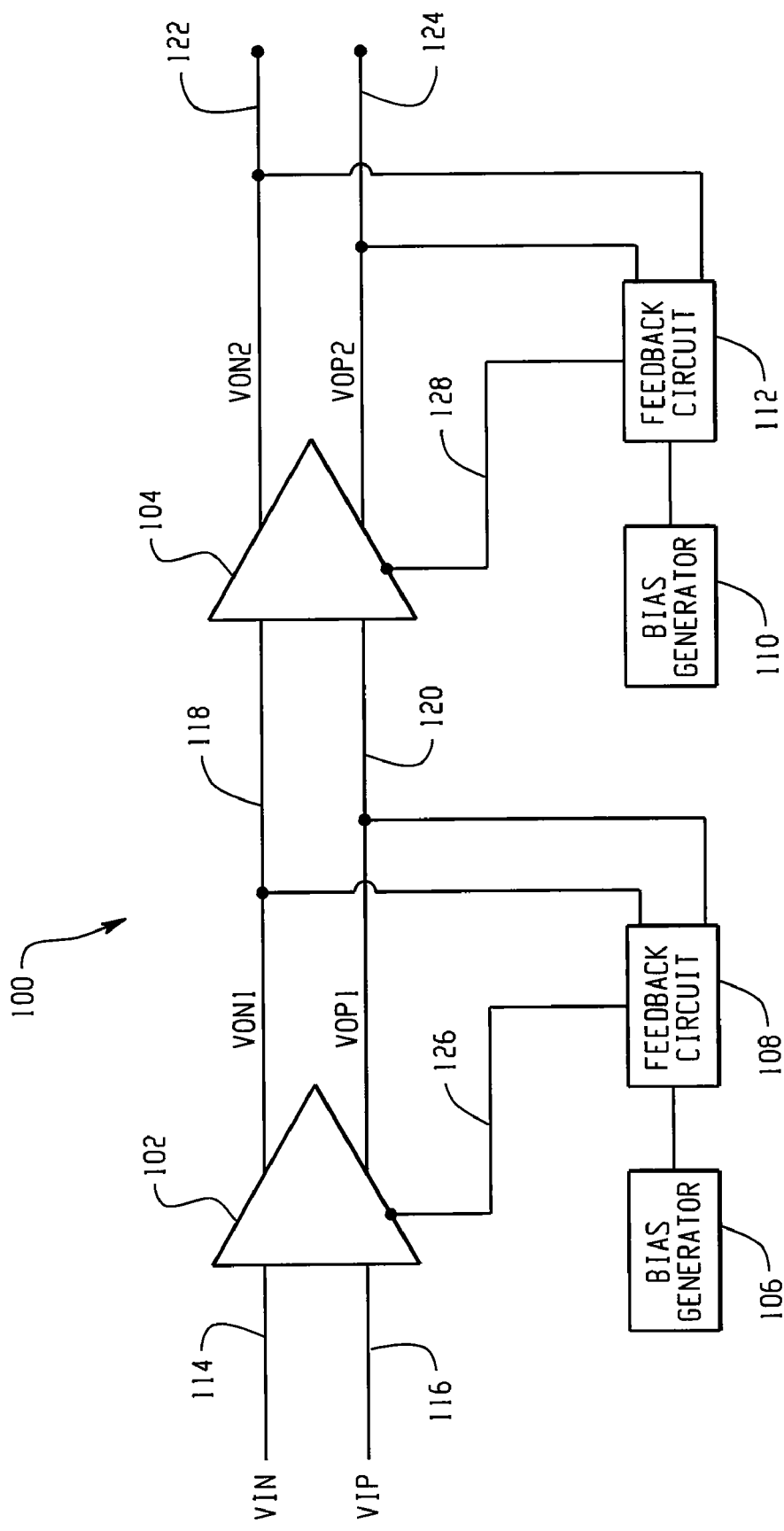
FIG. 1 is a circuit diagram of an example embodiment.

This description provides examples not intended to limit the scope of the invention, as claimed. The figures generally indicate the features of the examples, where it is understood and appreciated that like reference numerals are used to refer to like elements.

Described herein in an example embodiment is a method to set the common mode voltage of the first stage of an amplifier, such as a two gain stage Operational Amplifier (Op Amp). Both stages employ a full differential Op Amp structure to improve the high frequency performance and power supply rejection. To compensate for the process, the common mode bias of the first stage Op Amp is adjusted to maximize the output swing of the second stage by keeping the output transistors in saturation.

Referring to FIG. 1, there is illustrated a two gain stage amplifier 100 in accordance with an example embodiment. Amplifier 100 comprises a first stage amplifier 102 and a second stage amplifier 104. As illustrated, the first stage amplifier 102 and the second stage amplifier 104 are differential amplifiers. As those skilled in the art can readily appreciate, this configuration is suitable for the fabrication of an Op Amp.

First stage amplifier 102 has two differential inputs, VIN 114 and VIP 116. First stage amplifier 102 comprises two outputs VON1 and VOP1 which are operably coupled to first and second inputs of second stage amplifier 102 as illustrated by 118, 120. Bias generator 106 provides a set point for the common mode voltage for first stage amplifier 102. Feedback circuit 108 receives the bias set point from bias generator 106 and outputs VON1 and VOP1 of the first stage differential amplifier 102 and generates a common mode control signal 126 to set the common mode voltage of first stage amplifier 102.

In an example embodiment, bias generator 106 generates a common mode reference voltage and a common mode bias voltage reference, which are provided to feedback circuit 108. Feedback circuit 108 comprises a switched capacitor bank. In an example embodiment, control signal 126 is derived from $$VBN1 + \left(\frac{VOP1 - VON1}{2} - VCM1\right),$$

where VBN1 is the common mode bias reference voltage, VOP1 one output of first stage amplifier 102, VON1 is the other output of first stage amplifier 102 and VCM1 is the common mode reference voltage for first stage amplifier 102.

Second stage amplifier 104 has two differential inputs coupled to outputs VON1 and VOP1 of first stage amplifier 102 as illustrated by 118 and 120. Second stage amplifier 104 comprises two outputs VON2 and VOP2 represented by 122, 124 respectively. Bias generator 110 provides a set point for the common mode voltage for second stage amplifier 104. Feedback circuit 112 receives the bias set point from bias generator 110 and outputs VON2 and VOP2 of the second stage differential amplifier 104 and generates a common mode control signal 128 to set the common mode voltage of first stage amplifier 104.

In an example embodiment, bias generator 110 generates a common mode reference voltage for the second stage (also referred to herein as VCM2), which is provided to feedback circuit 112. Feedback circuit 112 comprises a switched capacitor bank. In an example embodiment, feedback circuit 112 also receives the common mode bias reference voltage (VBN1) from bias generator 106. Feedback circuit 112 produces control signal 128 based on VBN1, VCM2, VON2 and VOP2.

An aspect of the example embodiment illustrated in FIG. 1 is that the common mode voltage for each stage is set independently. The common mode voltage for first stage amplifier 102 is based on feedback received from the first stage outputs VON1, VOP1 and VBN1 and VCM1, whereas the common mode voltage for the second stage is based on feedback received from the second stage outputs VON2, VOP2, and VBN1 and VCM2. This arrangement can allow for greater output signal width for the second stage when compared to amplifiers that employ either one common mode feedback circuit or use two common mode feedback circuits to set the common mode voltage for both stages. As will be described herein, the embodiment illustrated in FIG. 1 can compensate for variations in threshold voltage (Vt).

Figure 2A:
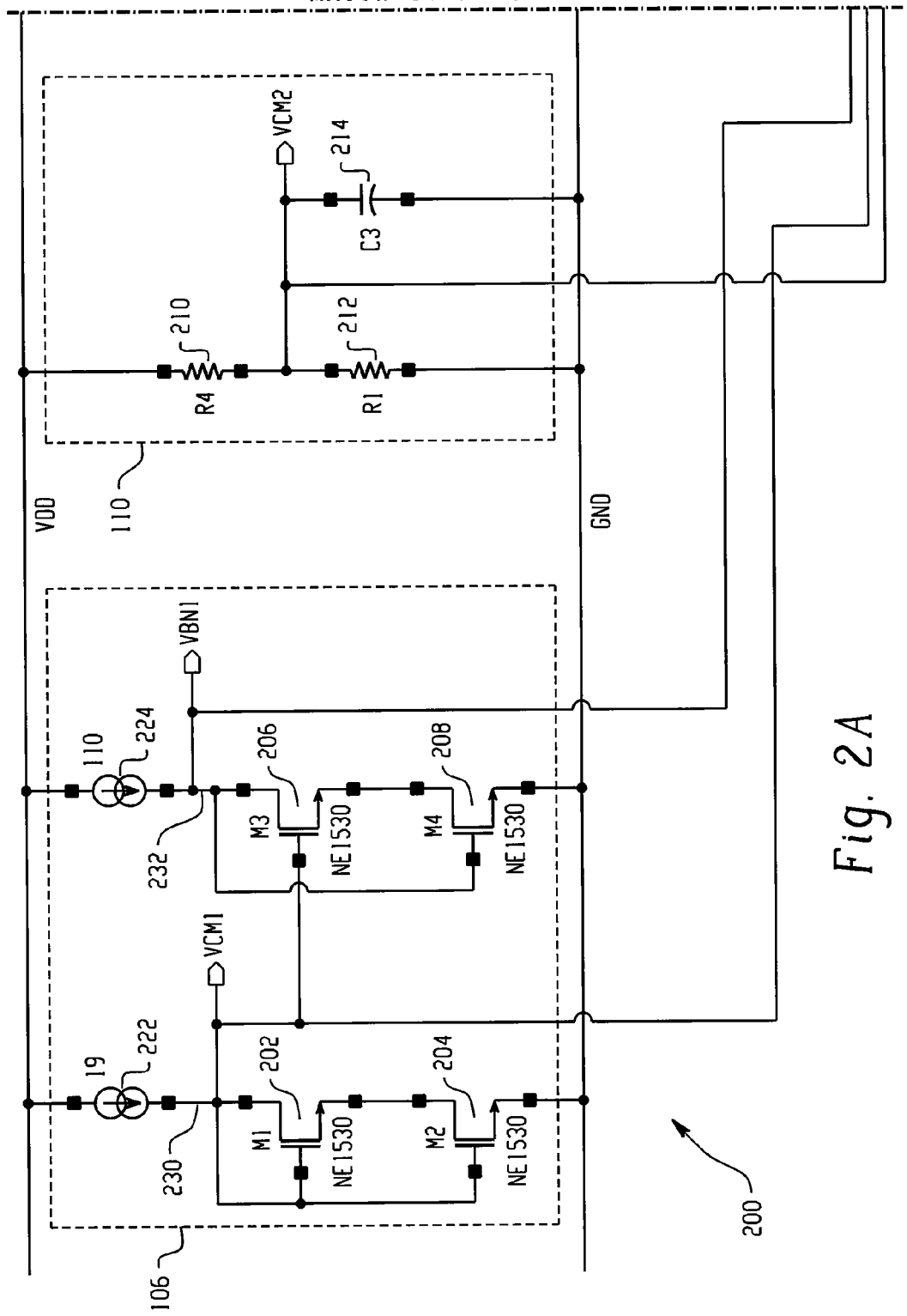
FIG. 2 is a detailed circuit diagram of the example embodiment of FIG. 1.
Figure 2B:
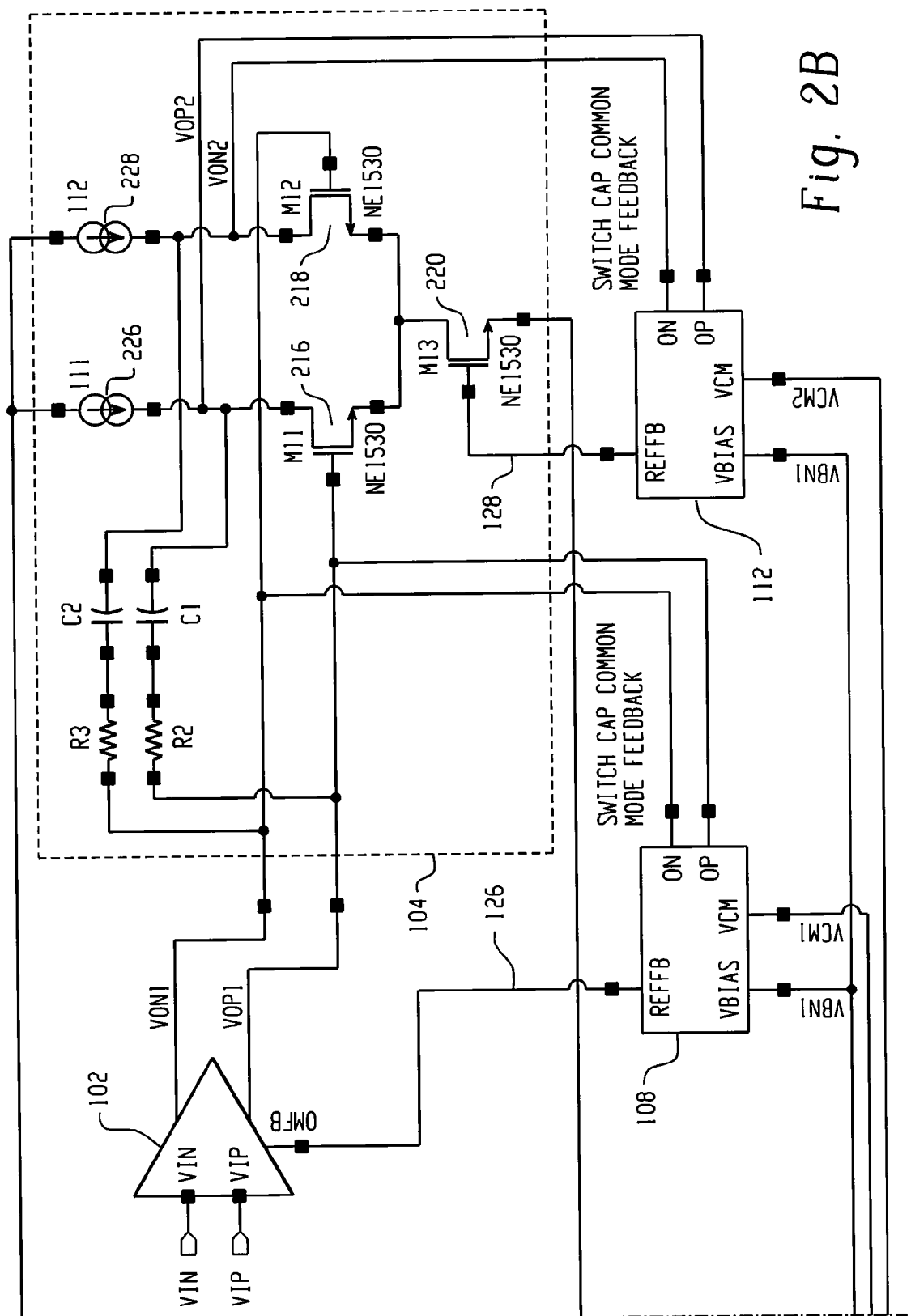

Referring to FIG. 2, there is illustrated a detailed circuit diagram of a two stage amplifier 200 configured in accordance to amplifier 100 in FIG. 1. As illustrated in FIG. 2, bias circuit 106 comprises a first circuit, the first circuit comprising current source 222 and transistors 202, 204. Node 230, which is between current source 222 and the drain of transistor 202 is coupled to the gates of transistors 202, 204 and 206. The common mode reference voltage for the first stage (VCM1) is acquired at node 230. Because node 230 is coupled to the gate of transistor 204, VCM1 is equal to voltage at the gate of transistor 204 (VGS_M2). In this configuration, transistor 204 is operating in saturation while transistor 202 is operating in the linear region. In an example embodiment, the sizes of transistors 202, 204 are scaled to have the same current density as the input differential pair of the second stage to match the bias circuit with the differential pair of the second stage for process corners.

Node 232, which is between current source 224 and the drain of transistor 206, is coupled to the gate of transistor 208. The common mode bias voltage (VBN1) is acquired from node 232. Because node 232 is coupled to the gate of transistor 208, VBN1 is equal to the voltage at the gate of transistor 208 (VGS_M4).

Bias circuit 110 is a voltage divider circuit comprising resistors 210, 212 and with capacitor 214 coupled in parallel with resistor 212. The second stage common mode reference voltage (VCM2) is acquired between resistors 210, 212. This yields a transfer function of $$\frac{VDD}{2 + RCS}.$$

Assuming resistors 210, 212 are equal, and the value of C is very small, this yields VCM2=VDD/2.

Figure 4:
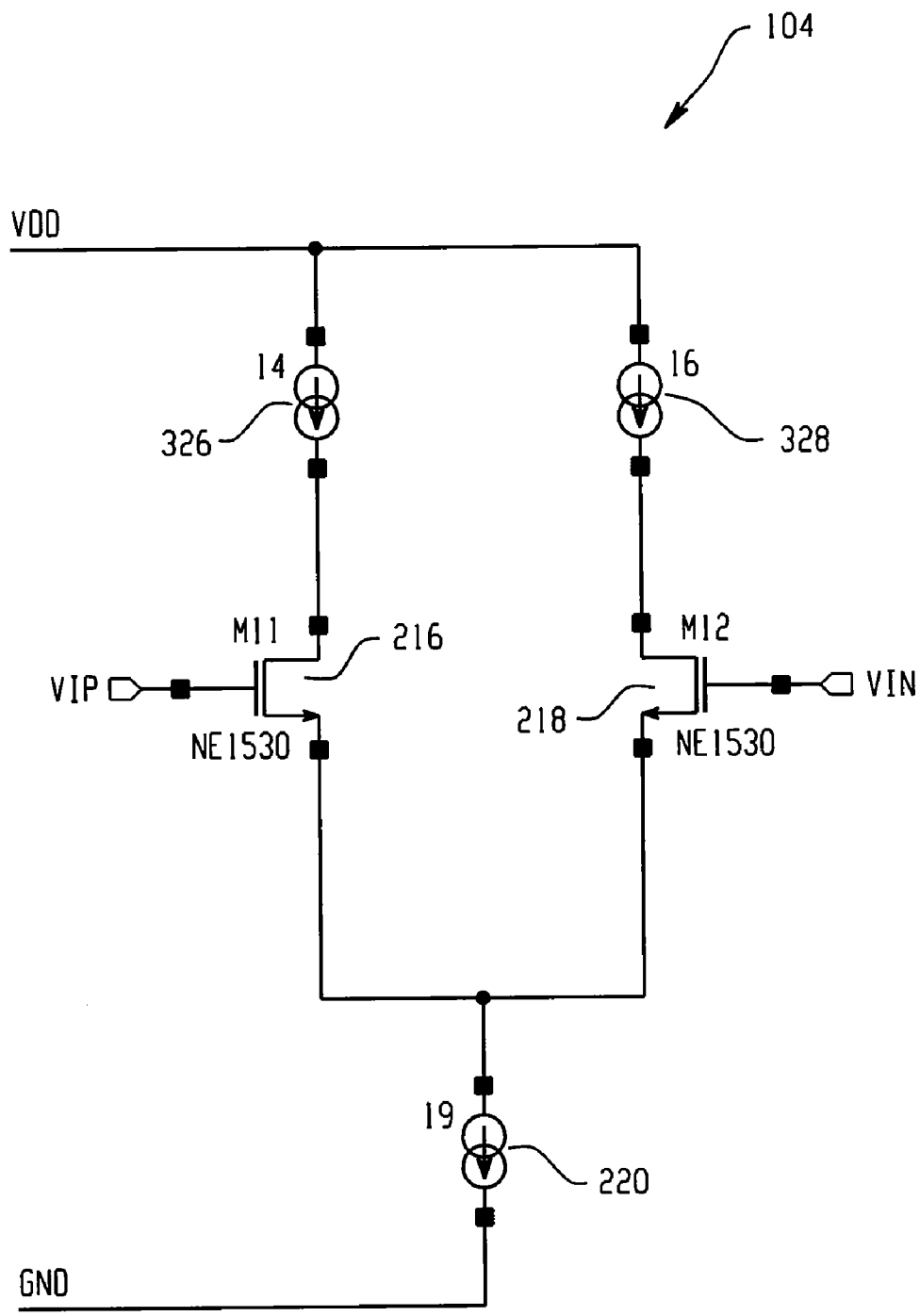
FIG. 4 is a detailed circuit diagram of the second stage of a two stage amplifier suitable for the example embodiment of FIG. 1.

The second (output) stage amplifier 104 is a differential amplifier comprising current source 226 and transistor 216 in parallel with current source 228 and transistor 218. Transistor 220 (a current source) couples transistors 216, 218 to ground. An exploded view of amplifier 104 is provided in FIG. 4. The common mode voltage at transistors 216 and 218 is VCM1. Thus, the output voltage swing for the second (output) stage is [VDD-VDSAT_226]−VDSAT_216+VDSAT_218], assuming that VDSAT_226 is the saturation voltage of current source 226 and that and that current source 226 is equal to current source 228.

Below, the gate to source voltage of transistor 216 is represented as VGS and the drain to source voltage of transistor 216 is represented as VDS, VS is the Source voltage of transistor 216 and VT is the threshold voltage for transistor 216.

This yields, $VGS=VDS+VT$;

$VGS-VT=VDSAT$;

and $VG-VS-VT=VDSAT$;

however, VG=VCM1;

Therefore, $VCM1-VS-VT=VDSAT$, or $VCM1=VS+VT+VDSAT=k+VT$

From the foregoing, VCM1 is a function of VT. If VT changes with process, then VCM1 changes to compensate.

In an example embodiment, feedback circuit 108 is a switched capacitor common mode feedback circuit. In an example embodiment, a folded cascode gain boosting Op Amp 300 (FIG. 3) is employed for first stage amplifier 102, and the switched capacitor common mode feedback circuit operates over a wide range of output voltages, still maintaining high gain. The switched capacitor common mode feedback generates a control voltage that sets the common mode of the first stage, $$VCONTROL = VBN1 + \left(\frac{VOP1 - VON1}{2} - VCM1\right).$$

Figure 3:
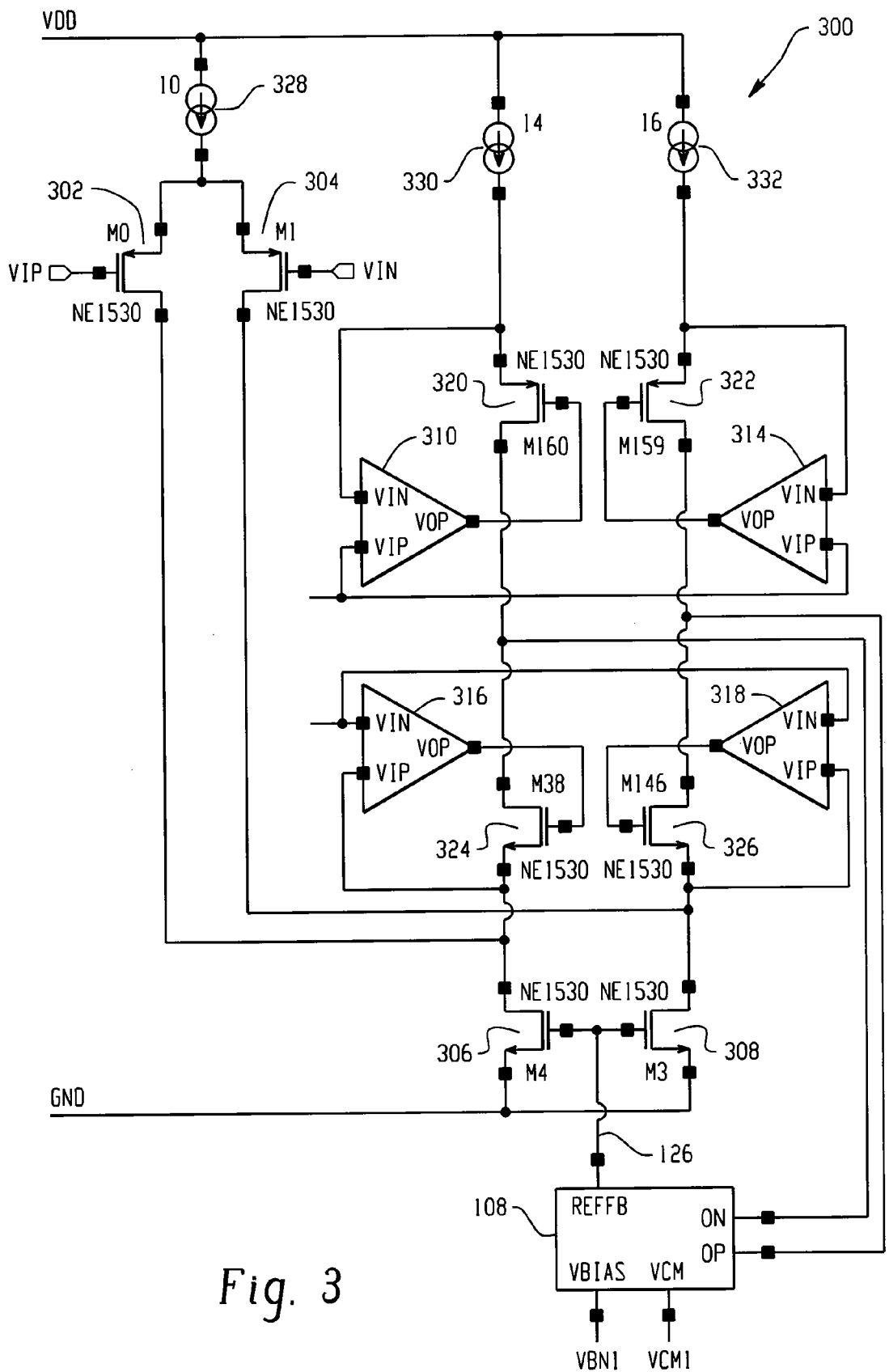
FIG. 3 is a detailed circuit diagram of the first stage of a two stage amplifier suitable for the example embodiment of FIG. 1.

FIG. 3 illustrates a folded cascode gain boosting Op Amp 300 suitable for first stage amplifier 102 (FIGS. 1 and 2). Amplifier 300 comprises a differential pair 302, 304 of transistors coupled to current source 328. Differential transistors 302, 304 are coupled to transistors 306, 308, which receive their gate voltage from feedback circuit 108. The gate voltages of transistors 306, 308 are set to the voltage of control signal 126. Additional current can be provided to transistor 306 from current source 330 which is switched through transistor 320 (controlled by Op Amp 310) and transistor 324 (controlled by Op Amp 316). Additional current can be provided to transistor 308 from current source 332 which is switched through transistor 322 (controlled by Op Amp 314) and transistor 326 (controlled by Op Amp 318).

One of the first stage's differential outputs (VON1) is acquired between transistors 320 and 324. The other of the first stage's differential outputs (VOP1) is acquired between transistors 322 and 326.

Figure 5:
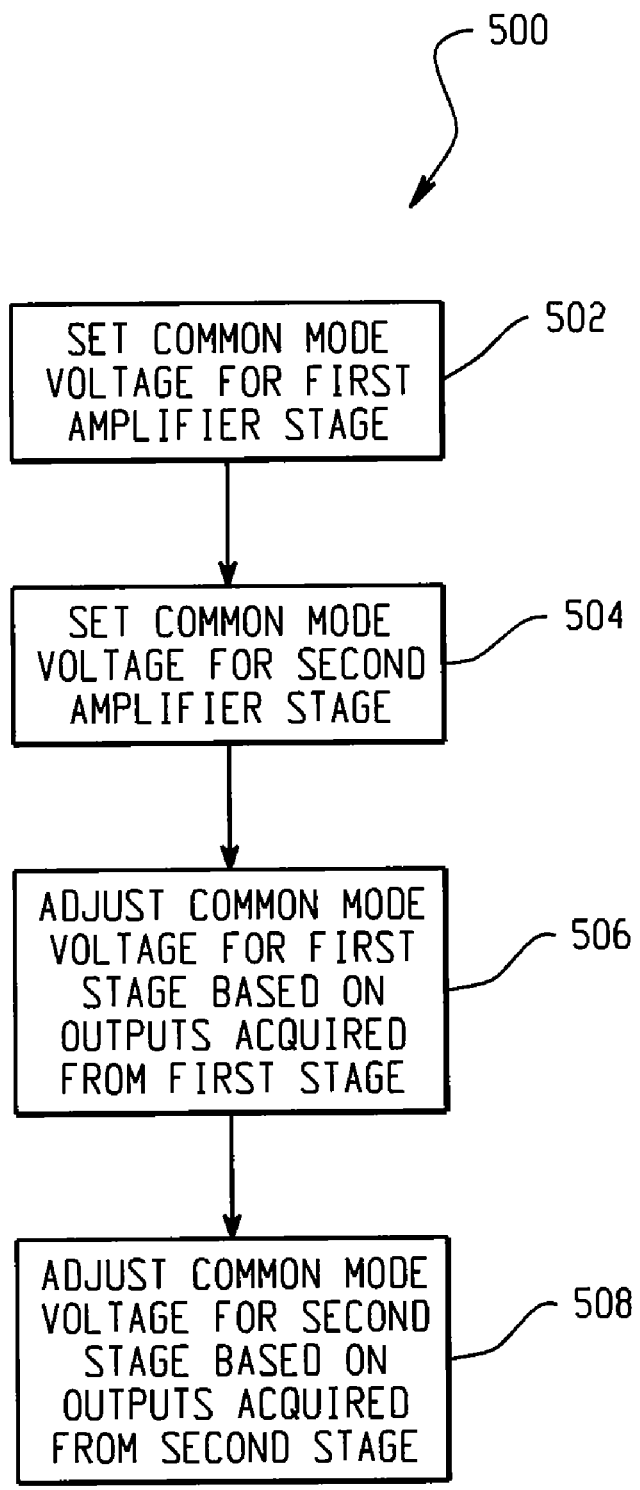
FIG. 5 illustrates an example methodology.

In view of the foregoing structural and functional features described above, a methodology 500 in accordance with an example embodiment will be better appreciated with reference to FIG. 5. While, for purposes of simplicity of explanation, methodology 500 of FIG. 5 is shown and described as executing serially, it is to be understood and appreciated that the present invention is not limited by the illustrated order, as some aspects could occur in different orders and/or concurrently with other aspects from that shown and described herein. Moreover, not all illustrated features may be required to implement methodology 500 in accordance with an aspect the present invention.

At 502, the common mode voltage for the first stage of a two stage amplifier is set. A bias generator circuit, such as was illustrated in FIG. 2 can be employed to set the common mode voltage.

At 504, the common mode voltage is set for the second stage of a two stage amplifier. A bias generator, such as was illustrated in FIG. 2 can be employed to set the common mode voltage for the second stage. In an example embodiment, the common mode voltage for the first stage is set independently of the common mode voltage for the second stage.

At 506, the common mode voltage for the first stage is adjusted based on outputs acquired from the first stage. In an example embodiment, a feedback circuit is employed that compares the output voltages of the first stage with the common mode voltage set at 502. In an example embodiment, a common mode switched capacitor bank can be employed for adjusting the common mode voltage for the first stage.

At 508, the common mode voltage for the second stage is adjusted based on outputs acquired from the second stage. In an example embodiment, a feedback circuit is employed that compares the output voltages of the second stage with the common mode voltage set at 504. In an example embodiment, a common mode switched capacitor bank can be employed for adjusting the common mode voltage for the second stage.

What has been described above includes example implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims interpreted in accordance with the breadth to which they are fairly, legally and equitably entitled.

The invention claimed is:

1. An apparatus, comprising:
a first stage amplifier having an input and an output, the first stage amplifier is a differential amplifier, wherein the input of the first stage amplifier comprises first and second inputs and the output of the first stage amplifier comprises first and second outputs;
a second stage amplifier having an input and an output, the input of the second stage amplifier is operably coupled to the output of the first stage amplifier, the second stage amplifier is a differential amplifier, wherein the input of the second stage amplifier comprises first and second inputs and the output of the second stage amplifier comprises first and second outputs, wherein the first input of the second stage amplifier is coupled to the first output of the first stage amplifier and the second input of the second stage is coupled to the second output;
a first bias circuit operable to set a common mode voltage of the first amplifier;
a second bias circuit operable to set a common mode voltage of the second amplifier;
a first feedback circuit operably coupled to the first bias circuit and the output of the first stage, the first feedback circuit is operable to control the common mode voltage of the first stage amplifier based on the common mode voltage set by the first bias circuit and the output of the first stage amplifier; and
a second feedback circuit coupled to the second bias circuit and the output of the second stage, the second feedback circuit is operable to control the common mode voltage of the second stage amplifier based on the common mode voltage set by the second bias circuit and the output of the second stage amplifier.

2. An apparatus according to claim 1, wherein the first stage amplifier is a folded cascode amplifier.

3. An apparatus according to claim 1, wherein first stage amplifier and second stage amplifier form a two gain stage operational amplifier.

4. An apparatus according to claim 1, wherein the second feedback circuit comprises a common-mode voltage feedback circuit.

5. An apparatus according to claim 1, wherein the first feedback circuit comprises:
a first current source;
a first transistor having a gate, a source and drain, wherein the drain is coupled to the first current source;
a second transistor having a gate, a source and drain, wherein the drain of the second transistor is coupled to the source of the first transistor;
a second current source;
a third transistor having a gate, a source and drain, wherein the drain of the third transistor is coupled to the second current source; and
a fourth transistor having a gate, a source and drain, wherein the drain of the fourth transistor is coupled to the source of the third transistor;
wherein the gates of the first, second and third transistors are coupled to the drain of the first transistor; and
wherein the gate of the fourth transistor is coupled to the drain of the third transistor.

6. An apparatus according to claim 5, wherein the first stage amplifier is a differential amplifier having first and second outputs;
wherein the first feedback circuit is configured to set the common-mode voltage of the first stage amplifier to $$VBN1 + \left(\frac{VOP - VON}{2} - VCM1\right);$$

wherein VBN1 is the voltage at the drain of the third transistor;
wherein VOP is an output voltage at the first output of the differential amplifier;
wherein VON is an output voltage at the second output of the differential amplifier; and
wherein VCM1 is the output voltage at the drain of the first transistor.

7. An apparatus according to claim 6, wherein the second bias circuit comprises first and second resistors in series and a capacitor in parallel with the second resistor, wherein the common mode voltage for the second stage is acquired at a node between the first and second resistors.

8. An apparatus according to claim 1, wherein the second stage amplifier is a differential amplifier comprising:
a first circuit comprising a first current source and a first transistor;
a second circuit in parallel with the first differential circuit, comprising a second current source and a second transistor; and a controllable current source coupled to the first and second transistors.

9. An apparatus according to claim 1, wherein the first feedback circuit comprises a switched capacitor network.

10. An apparatus according to claim 1, wherein the second feedback circuit comprises a switched capacitor network.

11. A method, comprising:
   setting a common mode voltage for a first stage differential amplifier;
   setting a common mode voltage for a second stage differential amplifier in cascade with the first stage differential amplifier;
   acquiring feedback from outputs of the first stage amplifier;
   adjusting the common mode voltage for the first stage based on the feedback acquired from the outputs of the first stage amplifier
   acquiring feedback from outputs of the second stage amplifier; and
   adjusting the common mode voltage for the second stage based on the feedback acquired from the outputs of the second stage amplifier.

* * * * *